(12) United States Patent
Takagi et al.

(10) Patent No.: US 8,643,438 B2
(45) Date of Patent: Feb. 4, 2014

(54) CLASS-AB POWER AMPLIFIER

(75) Inventors: Kazutaka Takagi, Kawasaki (JP);
Naotaka Tomita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/267,115

(22) Filed: Oct. 6, 2011

(65) Prior Publication Data

US 2012/0218040 A1 Aug. 30, 2012

(30) Foreign Application Priority Data

Feb. 28, 2011 (JP) ................... 2011-042674

(51) Int. Cl.
*H03F 3/60* (2006.01)

(52) U.S. Cl.
USPC .......................................... 330/277; 330/302

(58) Field of Classification Search
USPC ..................... 330/302, 286, 53, 277
See application file for complete search history.

(56) References Cited

U.S. PATENT DOCUMENTS

| 7,741,907 B2 | 6/2010 | Takagi et al. | |
|---|---|---|---|
| 8,154,340 B2 * | 4/2012 | Dupuy et al. | 330/126 |
| 2012/0105147 A1 * | 5/2012 | Harris et al. | 330/57 |

FOREIGN PATENT DOCUMENTS

| JP | 7-46064 | 2/1995 |
|---|---|---|
| JP | 2000-106510 | 4/2000 |
| JP | 2008-263438 | 10/2008 |
| JP | 2009-94805 | 4/2009 |
| JP | 2011-35761 | 2/2011 |
| JP | 2012-518373 | 8/2012 |
| WO | WO 2011/007529 A1 | 1/2011 |

OTHER PUBLICATIONS

Peter Wright, et al., "A Methodology for Realizing High Efficiency Class-J in a Linear and Broadband PA", IEEE Transactions on Microwave Theory and Techniques, vol. 57, No. 12, Dec. 2009, pp. 3196-3204.
Steve C. Cripps, et al., "New PA Modes for a New PA Technology", IEEEMTT-S Workshop (WSF), Jul. 2010, 20 pages.
U.S. Appl. No. 13/728,167, filed Dec. 27, 2012, Takagi.
Japanese Office Action issued Dec. 4, 2012, in Patent Application No. 2011-042674 (with English-language translation).
Office Action issued on Jun. 11, 2013 in corresponding Japanese Patent Application No. 2011-042674 with its English translation.
S.C. Cripps, P.J. Tasker, et al., "On the Continuity of High Efficiency Modes in Linear RF Power Amplifiers", IEEE Microwave and Wireless Components Letters, United States, IEEE, Oct. 2009, vol. 19, No. 10, pp. 665-667.

(Continued)

*Primary Examiner* — Hieu Nguyen
(74) *Attorney, Agent, or Firm* — Oblon, Spivak, McClelland, Maier & Neustadt, L.L.P.

(57) ABSTRACT

According to an embodiment, a class-AB power amplifier includes an amplifying element whose power supply voltage is expressed as Vdc and whose maximum current is expressed as Imax, a conduction angle $\theta o$ of the amplifying element being more than $\pi$(rad) and less than $2 \cdot \pi$(rad), and load impedance of a fundamental wave being expressed as $Z1 = R1 + j \cdot X1$ and load impedance of a 2nd harmonic being expressed as $Z2 = R2 + j \cdot X2$ which are observed from a dependent current source of an equivalent circuit of the amplifying element, wherein a relationship between variables X1 and R1 is set to $-R1 \le X1 \le R1$, variable R1 is set to $R1 = Vdc/Imax \cdot \pi \cdot \{1 - \cos(\theta o/2)\} / \{\theta o/2 - \sin(\theta o)/2\}$, and variable X2/X1 is set to $X2/X1 = -\{\theta o/2 - \sin(\theta o)/2\} / \{\sin(\theta o/2) - \sin(1.5 \cdot \theta o)/3\}$, or each of the variables is set thereto so as to become equal substantially.

9 Claims, 10 Drawing Sheets

(56) References Cited

OTHER PUBLICATIONS

Yoichiro Takayama, Kazuhiko Honjo, "Foundation and Applicability for High Degree of Efficiency and Reduction in Distortion of Microwave Power Amplifier", Paper Magazine C of the Institute of Electronics, Information and Communication Engineers, Japan, Institute of Electronics, Information and Communication Engineers, Dec. 2008, vol. J91-C, No. 12 pp. 677-689.

* cited by examiner

CLASS-AB POWER AMPLIFIER

CROSS REFERENCE TO RELATED APPLICATIONS

This application is based upon and claims the benefit of priority from prior Japanese Patent Application No. P2011-042674 filed on Feb. 28, 2011, the entire contents of which are incorporated herein by reference.

FIELD

Embodiment described herein generally relate to a class-AB power amplifier.

BACKGROUND

Conventionally, a power amplifier for communication applications of which high linearity is required has been composed using a class-A power amplifier. However, along with progress in a linearizer in recent year, an instance of a power amplifier for communication applications composed of a highly efficient class-B power amplifier has increased, although linearity of the class-B power amplifier is poorer than that of a class-A power amplifier.

However, since a gain at the time of a small signal decreases due to the nonlinear characteristics of the amplifying element, or it becomes a class-C operation due to a temperature variation, etc., a distortion is increased, thereby lacking in distortion compensation factors of the linearizer. Therefore, a class-AB power amplifier in the middle between the class-A power amplifier and the class-B power amplifier is often used in actuality.

If load impedance matching only of a fundamental wave is performed, a class-A operation will get close to 50% of theoretical efficiency. However, in order to improve the efficiency of a class-AB operation, load impedance for higher order harmonics must be made to short-circuit based on theory. Therefore, in the class-AB operation, the degree of difficulty in achieving broader bandwidths is great.

On the other hand, also in the class-B operation, since load impedance for higher order harmonics has to be made to short-circuit based on theory in order to get close to 78.5% of the theoretical efficiency, the degree of difficulty in achieving the broader bandwidths was great.

On the other hand, a class-J/B operation received attention recently can achieve the same efficiency as to the class-B operation over the broader bandwidths.

Although the class-B power amplifier can achieve the broader bandwidths, linearity of the class-B power amplifier is poorer than that of the class-AB power amplifier. Although the linearity of the class-AB power amplifier is better efficiency than that of the class-B power amplifier, the bandwidth of the class-AB power amplifier is narrower than that of the class-B power amplifier.

DETAILED DESCRIPTION

Hereinafter, embodiments will be described with reference to drawings.

A class-AB power amplifier according to the present embodiment comprises an amplifying element whose power supply voltage is expressed as Vdc and whose maximum current is expressed as Imax, a conduction angle $\theta o$ of the amplifying element being more than $\pi(rad)$ and less than $2 \cdot \pi(rad)$, and load impedance of a fundamental wave being expressed as $Z1=R1+j\cdot X1$ and load impedance of a 2nd harmonic being expressed as $Z2=R2+j\cdot X2$ which are observed from a dependent current source of an equivalent circuit of the amplifying element, wherein a relationship between variables X1 and R1 is set to $-R1<=X1<=R1$, variable R1 is set to $R1=Vdc/Imax\cdot\pi\cdot\{1-\cos(\theta o/2)\}/\{\theta o/2-\sin(\theta o)/2\}$, variable X2/X1 is set to $X2/X1=-\{\theta o/2-\sin(\theta o)/2\}/\{\sin(\theta o/2)-\sin(1.5\cdot\theta o)/3\}$, or each of the variables is set thereto so as to become equal substantially.

Figure 1:
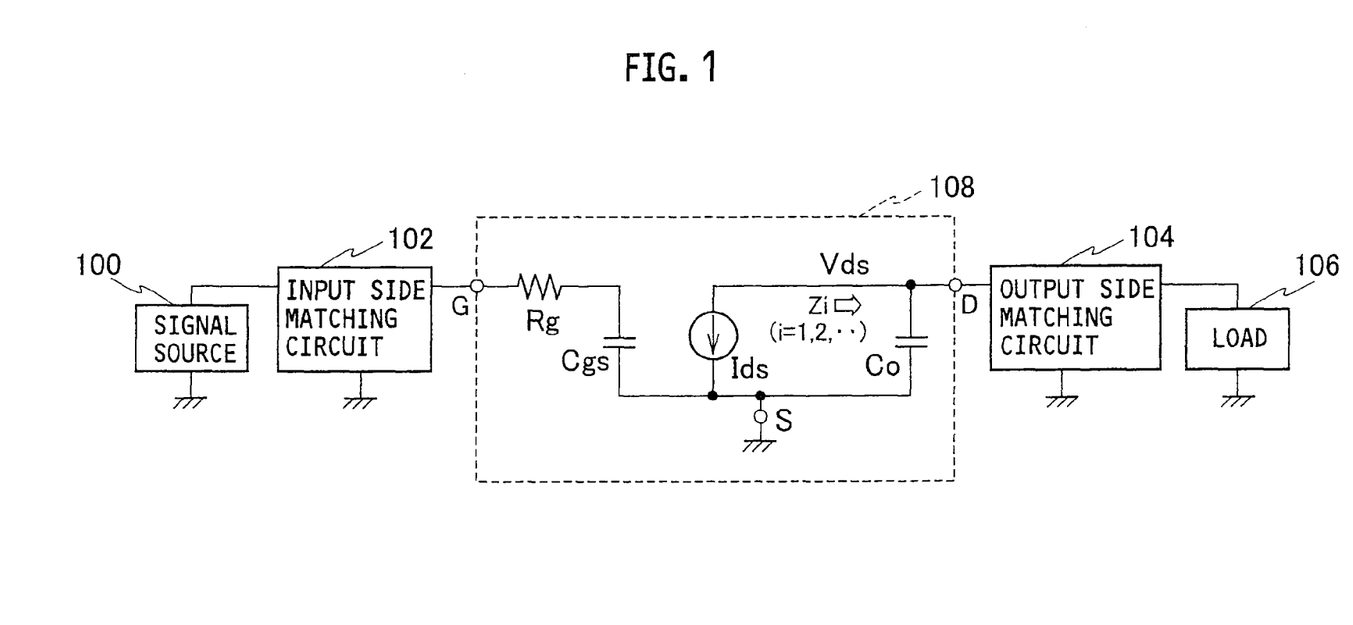
FIG. 1 is a diagram showing an example of an equivalent circuit simplified by omitting a bias circuit etc., in a class-AB power amplifier according to an embodiment.

In the class-AB power amplifier according to the embodiment, an example of an equivalent circuit simplified by omitting a bias circuit etc. is expressed as shown in FIG. 1.

Although not only a semiconductor but also a vacuum tube etc. may be sufficient as the amplifying element, it will explain a source common Field Effect Transistor (FET) 108 as the amplifying element, hereinafter.

As shown in FIG. 1, the equivalent circuit of the class-AB power amplifier according to the embodiment includes: a gate resistance Rg and a capacitor Cgs between gate and source configured to be connected in series between a gate terminal electrode G and a source terminal electrodes S; a current source Ids and an output capacitance Co configured to be connected in parallel between the drain terminal electrode D and the source terminal electrode S; an input side matching circuit 102 configured to be connected to the gate terminal electrode G; and an output side matching circuit 104 configured to be connected to the drain terminal electrode D.

Furthermore, a signal source 100 is connected to the input side matching circuit 102, and a load 106 is connected to the output side matching circuit 104.

A circuit configuration of an equivalent circuit of a class-B operation according to a comparative example is also the same as that of the equivalent circuit of the class-AB power amplifier according to the embodiment shown in FIG. 1. A difference between the class-AB operation and the class-B operation is a difference in both conduction angles. The difference in the both conduction angles is caused by a difference in both gate biases.

According to a theory of the class-B operation whose conduction angle is $\theta o=\pi(rad)$, maximum electric output power $Po=Vdc\cdot Imax/4$ in linearity are obtained, where power supply voltage of DC component of voltage Vds between drain and source is expressed as Vdc, the maximum current of current Ids of a dependent current source is expressed as Imax, load impedance of a fundamental wave observed from the dependent current source is expressed by the following equation, $Z1=R1+j\cdot X1=2\cdot Vdc/Imax$, and load impedance for higher order harmonics is expressed by the following equation, $Zi=Ri+j\cdot Xi=0$ (where $i=2, 3, \ldots$).

At this time, the electronic power supply current of the DC component of the current Ids is expressed by the following equation, $Idc=Imax/\pi$, power consumption is expressed as $Pdc=Vdc\cdot Imax/\pi$, and drain efficiency (abbreviated as efficiency, hereinafter) is expressed by the following equation, $\eta d=Po/Pdc=\pi/4=78.5\%$.

Figure 2:
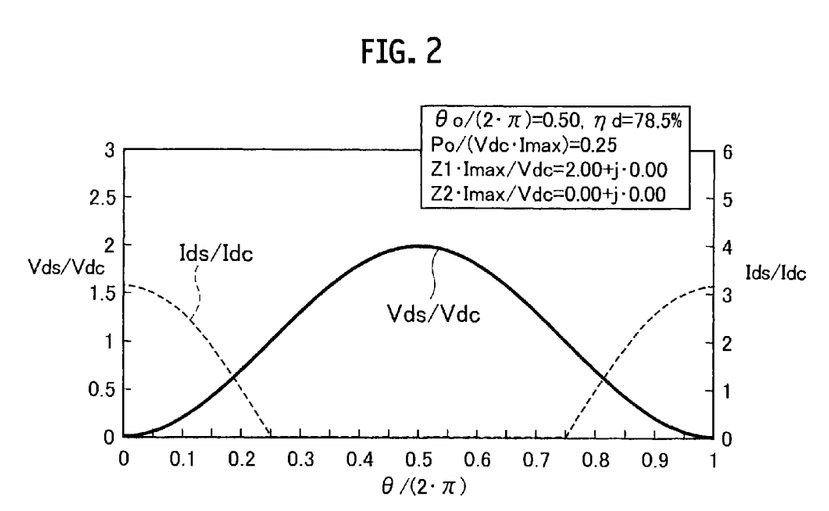
FIG. 2 is a diagram showing an example of waveforms of Vds/Vdc and Ids/Idc, in a class-B operation according to a comparative example.

An example of waveforms of Vds/Vdc and Ids/Idc of the class-B operation according to the comparative example is expressed as shown in FIG. 2. That is, as shown in FIG. 2, in waveforms where a horizontal axis indicates phase $\theta/(2\cdot\pi)$ standardized in one cycle, and a vertical axis indicates Ids/Idc of Ids standardized by Idc and Vds/Vdc of Vds standardized by Vdc, Ids contains no odd-number order harmonics component, and a 2nd harmonic component I2 for a fundamental wave component I1 of Ids is $I2/I1=0.42$. Furthermore, Vds contains no harmonic component.

However, in an actual output side matching circuit, even if not less than a 3rd harmonic component is ignored, equations $Z1=2\cdot Vdc/Imax$ and $Z2=0$ are unrealizable over the broader bandwidths.

Figure 3:
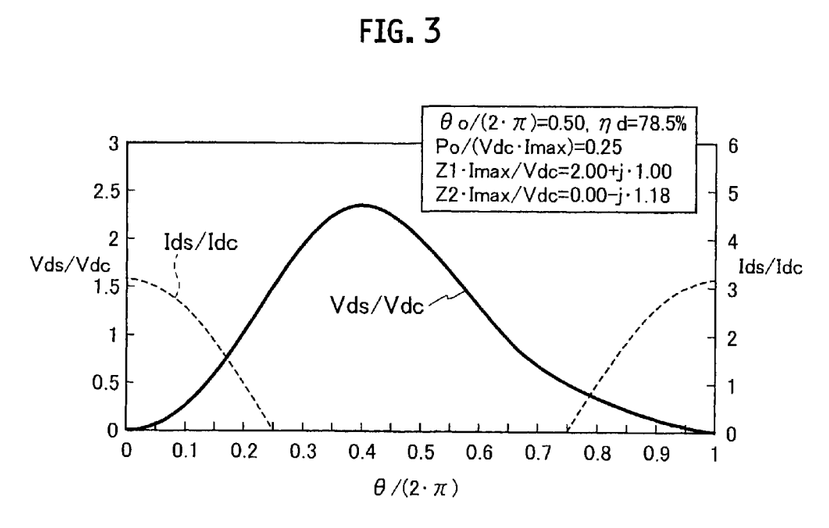
FIG. 3 is a diagram showing an example of waveforms of Vds/Vdc and Ids/Idc, in one example of a class-J/B operation according to the comparative example.
Figure 4:
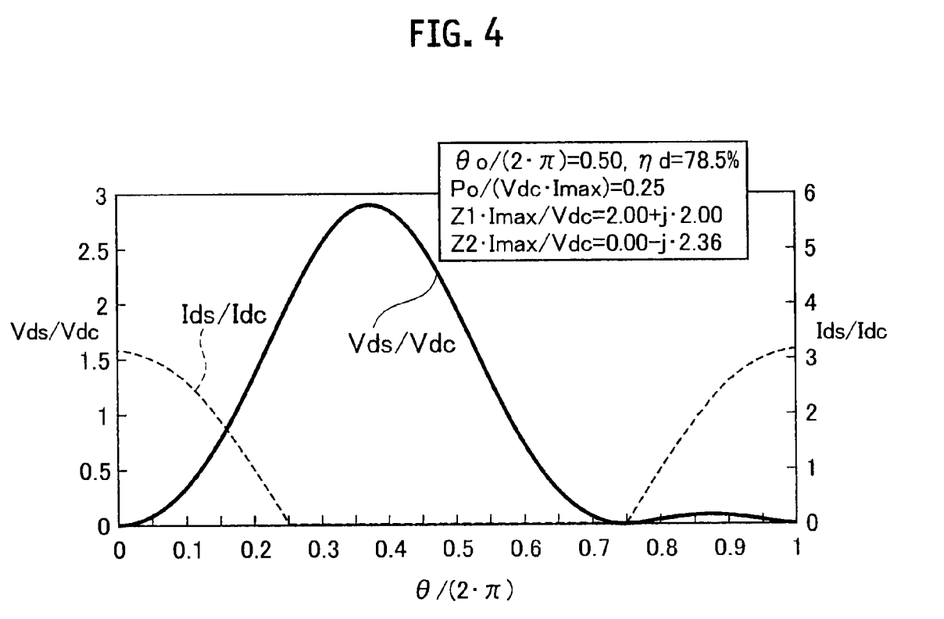
FIG. 4 is a diagram showing an example of waveforms of Vds/Vdc and Ids/Idc, in a class-J operation according to the comparative example.

On the other hand, an example of waveforms of Vds/Vdc and Ids/Idc of one example of a class-J/B operation according to the comparative example is expressed as shown in FIG. 3, and an example of waveforms of Vds/Vdc and Ids/Idc of a class-J operation according to the comparative example is expressed as shown in FIG. 4.

If $X2=-3\sim\pi/8\cdot X1=-1.18\cdot X1$ is satisfied even when equations $X1=0.5\cdot R1$ or $X1=R1$ are realized, for example, without R1 and R2 being changed for the class-B operation according to the comparative example shown in FIG. 2, neither $\eta d$ nor Po will be changed as shown in FIG. 3 or FIG. 4. Such condition is satisfied in $-R1<=X1<=R1$. In addition, although values of Ids of FIG. 3 and FIG. 4 are the same as that of FIG. 2, the fundamental wave components V1 of Vds in FIG. 3 and FIG. 4 become $1.12<0.15\cdot\pi(rad)$-fold and $1.41<0.25\cdot\pi(rad)$-fold as compared with V1 in FIG. 2, respectively, and the 2nd harmonic component V2 in FIG. 7 and FIG. 8 become $0.25<-0.5\pi(rad)$-fold and $0.5<-0.5\cdot\pi(rad)$ as compared with V1 in FIG. 2, respectively.

As mentioned above, in the output side matching circuit, the relationship between variables X1 and R1 is set to $-R1<=X1<=R1$, variable R1 is set into $R1=2\cdot Vdc/Imax$, and variable X2/X1 is set to $X2/X1=-3\cdot\pi/8=-1.18$, or each of the variables is set close thereto, and thereby the efficiency $\eta d$ and the maximum electric output power Po same as the class-B operation are achievable over the broader bandwidths.

However, since the class-J/B operation is the case where the conduction angle $\theta o$ is equal to $\pi(rad)$, the class-J3 operation is not applicable to the class-AB operation whose conduction angle $\theta o$ is more than $\pi(rad)$.

An class-EJ operation which aimed at improvement in efficiency of the class-J operation is also a case where the conduction angle $\theta o$ is equal to $\pi(rad)$.

In the class-AB operation whose conduction angle $\theta o$ is more than $\pi(rad)$, the load impedance of the fundamental wave and the load impedance of the 2nd harmonic are applied as a function of $\theta o$, and thereby providing a class-AB power amplifier having a high linearity and high degree of efficiency over the broader bandwidths.

The DC component of Ids is expressed by the following equation, $$Idc=Imax\cdot\{\sin(\theta o/2)-\theta o/2\cdot\cos(\theta o/2)\}/[\pi\cdot\{1-\cos(\theta o/2)\}],$$

and is expressed by $Idc=0$ at the time of $\theta o=0$, is expressed by $Idc=Imax/\pi$ at the time of $\theta o=\pi$, and is expressed by $Idc=Imax/2$ at the time of $\theta o=2\cdot\pi$.

The fundamental wave component of Ids is expressed by the following equation, $$I1=Imax\cdot\{\theta o/2-\sin(\theta o)/2\}/[\pi\cdot\{1-\cos(\theta o/2)\}],$$

and is expressed by $I1=0$ at the time of $\theta=0$, is expressed by $I1=Imax/2$ at the time of $\theta o=\pi$, and is expressed by $I1=Imax/2$ at the time of $\theta o=2\cdot\pi$.

The 2nd harmonic component of Ids is expressed by the following equation, $$I2=Imax\cdot\{\sin(\theta o/2)/2-\sin(1.5\cdot\theta o)/6\}/[\pi\cdot\{1-\cos(\theta o/2)\}],$$

and is expressed by $I2=0$ at the time of $\theta o=0$, is expressed by the greatest $I3=0.276\cdot Imax$ at the time of $\theta o=0.667\cdot\pi$, is expressed by $I2=0.212\cdot Imax$ at the time of $\theta o=\pi$, and is expressed by $I2=0$ at the time of $\theta o=2\cdot\pi$.

A root mean square value of Ids is expressed by the following equation, $$Irms = Imax \cdot [\theta o/2 - 3 \cdot \cos(\theta o/2) \cdot \sin(\theta o/2) + \theta o \cdot \{\cos(\theta o/2)\}^2]^{0.5} / [(2 \cdot \pi)^{0.5} \cdot \{1 - \cos(\theta o/2)\}],$$

and is expressed by Irms=0 at the time of $\theta o=0$, is expressed by Irms=Imax/2 at the time of $\theta o=\pi$, and is expressed by Irms=0.612·Imax at the time of $\theta o=2 \cdot \pi$.

Vds is expressed by the following equation, $$Vds = Vdc - [I1 \cdot \{R1 \cdot \cos(\theta) - X1 \cdot \sin(\theta)\} + I2 \cdot \{R2 \cdot \cos(2 \cdot \theta) - X2 \cdot \sin(2 \cdot \theta)\}],$$

and in the case of standardizing by Vdc, substituting above-mentioned I1 and I2, and assuming R2=0, the following equation is satisfied.

$$Vds/Vdc = 1 - [\{\theta o/2 - \sin(\theta o)/2\} \cdot \{R1 \cdot \cos(\theta) - X1 \cdot \sin(\theta)\} - \{\sin(\theta o/2)/2 - \sin(1.5 \cdot \theta o)/6\} \cdot X2 \cdot \sin(2 \cdot \theta)] \cdot Imax/Vdc/[\pi \cdot \{1 - \cos(\theta o/2)\}]] \quad (1)$$

In this case, Vds/Vdc is expressed by the following equation, $$Vds/Vdc = \{1 - \cos(\theta)\} \cdot \{1 - \beta \cdot \sin(\theta)\},$$

and if $-1 <= \beta <= +1$ is satisfied, Vds becomes Vds=0 once or twice per cycle and changes over a range of Vds>=0.

When the above is arranged using the following formula of the trigonometric function $\sin(\theta) \cdot \cos(\theta) = \sin(2 \cdot \theta)/2$, the following equation is satisfied.

$$Vds/Vdc = 1 - \cos(\theta) - \beta \cdot \sin(\theta) + \beta/2 \cdot \sin(2 \cdot \theta) \quad (2)$$

If the equation (1) is compared with the equation (2), the following equations (3) to (6) are satisfied.

$$1 = \{\theta o/2 - \sin(\theta o)/2\} \cdot R1 \cdot Imax/Vdc/[\pi\{1 - \cos(\theta o/2)\}] \quad (3)$$

$$\beta = -\{\theta o/2 - \sin(\theta o)/2\} \cdot X1 \cdot Imax/Vdc/[\pi \cdot \{1 - \cos(\theta o/2)\}] \quad (4)$$

$$\beta = \{\sin(\theta o/2) - \sin(1.5 \cdot \theta o)/3\} \cdot X2 \cdot Imax/Vdc/[\pi \cdot \{1 - \cos(\theta o/2)\}] \quad (5)$$

The following equation is given by the equation (3).

$$R1 = Vdc/Imax \cdot \pi \cdot \{1 - \cos(\theta o/2)\}/\{\theta o/2 - \sin(\theta o)/2\}$$

The following equation is given by the equation (3) and the equation (4).

$$-R1 <= X1 <= R1$$

The following equation is given by the equation (4) and the equation (5).

$$X2/X1 = -\{\theta o/2 - \sin(\theta o)/2\}/\{\sin(\theta o/2) - \sin(1.5 \cdot \theta o)/3\}$$

The following equations, $R1=\infty$ and $X2/X1=-0.5$, are satisfied at the time of $\theta o=0$, the following equations, $R1=2 \cdot Vdc/Imax$ and $X2/X1=-3 \cdot \pi/8=-1.18$, are satisfied at the time of $\theta o=\pi$, and the following equations, $R1=2 \cdot Vdc/Imax$, and $X2/X1=-\infty$, are satisfied at the time of $\theta o=2 \sim \pi$.

On the other hand, the power consumption Pdc of DC is expressed by the following equation, $$Pdc = Vdc \cdot Idc = Vdc \cdot Imax \cdot \{\sin(\theta o/2) - \theta o/2 \cdot \cos(\theta o/2)\}/[\pi \cdot \{1 - \cos(\theta o/2)\}],$$

and the following equation, Pdc=0, is satisfied at the time of $\theta o=0$, the following equation, Pdc=Vdc·Imax/$\pi$, is satisfied at the time of $\theta o=\pi$, and the following equation, Pdc→Vdc·Imax/2, is satisfied at the time of $\theta o=2 \cdot \pi$.

Maximum electric output power Po of the fundamental wave is expressed by the following equation, $$Po = 0.5 \cdot R1 \cdot I1^2 = 0.25 \cdot Vdc \cdot Imax \cdot \{\theta o - \sin(\theta o)\}/[\pi \cdot \{1 - \cos(\theta o/2)\}],$$

and the following equation, Po=0, is satisfied at the time of $\theta o=0$, the following equation, Po=Vdc·Imax/4, is satisfied at the time of $\theta o=\pi$, and the following equation, Po=Vdc·Imax/4, is satisfied at the time of $\theta o=2 \cdot \pi$.

Drain efficiency $\eta d$ is expressed by the following equation, $$\eta d = Po/Pdc = 0.25 \cdot \{\theta o - \sin(\theta o)\}/\{\sin(\theta o/2) - \theta o/2 \cdot \cos(\theta o/2)\},$$

and the following equation, $\eta d=1=100\%$, is satisfied at the time of $\theta o=0$, the following equation, $\eta d=\pi/4=78.5\%$, is satisfied at the time of $\theta o=\pi$, and the following equation, $\eta d=1/2=50\%$, is satisfied at the time of $\theta o=2 \cdot \pi$.

In the case of on resistance Ron of FET is not 0Ω, power loss Pron by the Ron is expressed by the following equation, $$Pron = Ron \cdot Irms^2 = Ron \cdot Imax2 \cdot [\theta o/2 - 3 \cdot \cos(\theta o/2) \cdot \sin(\theta o/2) + \theta o \cdot \{\cos(\theta o/2)\}^2]/[2 \cdot \pi \cdot \{1 - \cos(\theta o/2)\}^2],$$

and the following equation, Pron=0, is satisfied at the time of $\theta o=0$, the following equation, Pron=Ron·Imax$^2$/4, is satisfied at the time of $\theta o=\pi$, and the following equation, Pron=Ron·Imax$^2$·3/8, is satisfied at the time of $\theta o=2 \cdot \pi$.

A ratio Lo of Pron to Po is expressed by the following equation, $$Lo = Pron/Po = Ron \cdot Imax/Vdc \cdot [\theta o/2 - 3 \cdot \cos(\theta o/2) \cdot \sin(\theta o/2) + \theta o \cdot \{\cos(\theta o/2)\}^2]/[\{\theta o/2 - \sin(\theta o)/2\} \cdot \{1 - \cos(\theta o/2)\}],$$

and the following equation, Lo=Ron·Imax/Vdc·4/5, is satisfied at the time of $\theta o=0$, the following equation, Lo=Ron·Imax/Vdc, is satisfied at the time of $\theta o=\pi$, and the following equation, Lo=Ron·Imax/Vdc·3/2, is satisfied at the time of $\theta o=2 \cdot \pi$.

The above relation will be explained referring graphic charts hereinafter.

Figure 5:
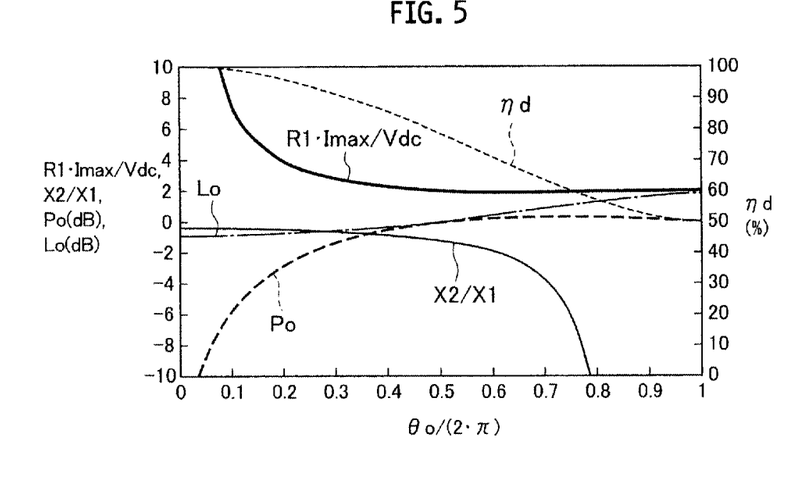
FIG. 5 is a diagram showing characteristics of each parameter $R1 \cdot Imax/Vdc$, $X2/X1$, Po, Lo, and $\eta d$ for a conduction angle $\theta o/(2 \cdot \pi)$, in the class-AB power amplifier according to the embodiment.

FIG. 5 shows characteristics of each parameter R1·Imax/Vdc, X2/X1, Po, Lo, and $\eta d$ for the conduction angle $\theta o/(2 \cdot \pi)$, in the class-AB power amplifier according to the embodiment.

FIG. 5 shows each parameter R1·Imax/Vdc, X2/X1, Po, Lo, and $\eta d$ at the time that the conduction angle $\theta o/(2 \cdot \pi)$ is changed from 0 to 1. If assumed as X1=X2=0, R1·Imax/Vdc, Po, Lo, and $\eta d$ are the same as that of the class-A operation to class-C operation, and $\theta o/(2 \cdot \pi)=1$ is corresponding to the class-A operation, $0.5 < \theta o/(2 \cdot \pi) < 1$ is corresponding to the class-AB operation, $\theta o/(2 \cdot \pi)=0.5$ is corresponding to the class-B operation, and $0 < \theta o/(2 \cdot \pi) < 0.5$ is corresponding to the class-C operation. Although $\eta d=78.5\%$ is realized in $\theta o/(2.7)=0.5$ of the class-B operation, the linearity is poorer than the class-AB operation in actuality. If assumed as $\theta o/(2 \cdot \pi)=0.6$ in the class-AB operation with more sufficient linearity than the class-B operation, for example, $\eta d=71.0\%$ is realized and therefore the class-AB operation is only 7.5% less efficiency as compared with the class-B operation. Moreover, R1·Imax/Vdc=1.89 is realized (and is 0.94-fold compared with the class-B operation) and Po is increased to 0.25 dB, and Lo=Pron/Po1=0.40 dB is realized (and is little less than the class-B operation). Although $X2/X1=-3 \cdot \pi/8=-1.18$ is realized in the case of $\theta o/(2 \cdot \pi)=0.5$ in the class-J/B operation, X2/X1=-1.90 is realized in the case of $\theta o/(2 \cdot \pi)=0.6$, for example, in the class-AB power amplifier according to the present embodiment.

Figure 6:
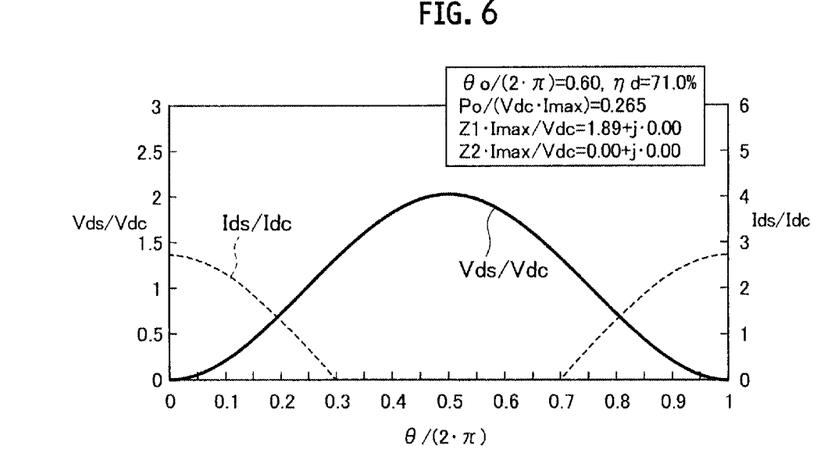
FIG. 6 is a diagram showing an example of waveforms of Vds/Vdc and Ids/Idc, in a class-AB operation according to the comparative example.

An example of waveforms of Vds/Vdc and Ids/Idc of the class-AB operation according to the comparative example is expressed as shown in FIG. 6.

In the class-AB operation (Zi=0, i=2, 3, ...) according to the comparative example, as clearly from Ids/Idc of the class-AB operation (Zi=0, i=2, 3, ...) of $\theta o/(2 \cdot \pi)=0.6$ shown in FIG. 6, the fundamental wave component I1 of Ids increases by 1.06-fold as compared with the class-B operation of I1 shown in FIG. 2, and the 2nd harmonic component I2 decreases by 0.28-fold as compared with I1 in FIG. 2. As clearly from Vds/Vdc shown in FIG. 6, the fundamental wave component V1 of Vds is the same as that of V1 in FIG. 2, and Vds contains no harmonic component.

Figure 7:
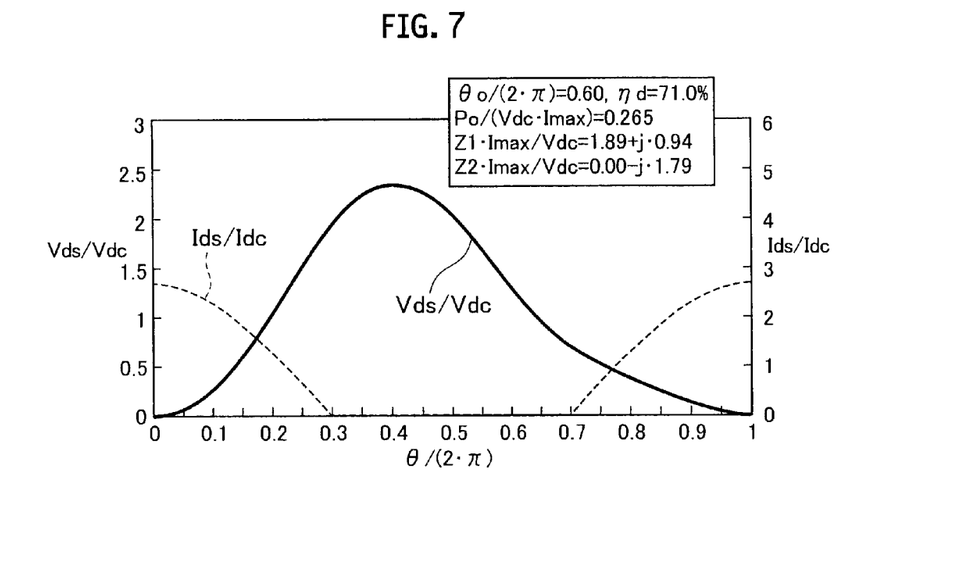
FIG. 7 is a diagram showing an example of waveforms of Vds/Vdc and Ids/Idc, in the class-AB power amplifier according to the embodiment.
Figure 8:
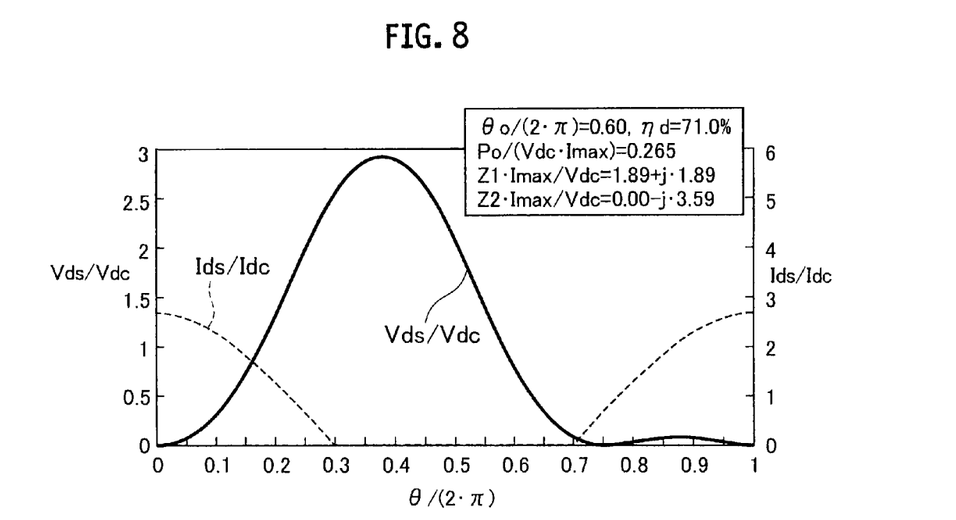
FIG. 8 is a diagram showing an example of alternative waveforms of Vds/Vdc and Ids/Idc, in the class-AB power amplifier according to the embodiment.

On the other hand, if X2/X1=−1.90 is satisfied even when equations X1=0.5·R1 or X1=R1 are realized, for example, without R1 and R2 being changed, neither the efficiency ηd nor the maximum electric output power Po will be changed as compared with FIG. 2, as shown in FIG. 7 or FIG. 8. Here, FIG. 7 shows an example of a waveform of Vds/Vdc and Ids/Idc, in the class-AB power amplifier according to the present embodiment, and FIG. 8 shows an example of another waveform of Vds/Vdc and Ids/Idc, in the class-AB power amplifier according to the present embodiment.

In addition, although values of Ids of FIG. 7 and FIG. 8 are also the same as that of FIG. 2, the fundamental wave components V1 of Vds in FIG. 7 and FIG. 8 become 1.12<0.15·π (rad)-fold and 1.41<0.25·π(rad)-fold as compared with V1 in FIG. 2, respectively, and the 2nd harmonic component V2 in FIG. 7 and FIG. 8 become 0.25<−0.5π(rad)-fold and 0.5<− 0.5·π(rad) as compared with V1 in FIG. 2, respectively. The above-mentioned relations are the same as that of FIG. 2 to FIG. 4.

Figure 9:
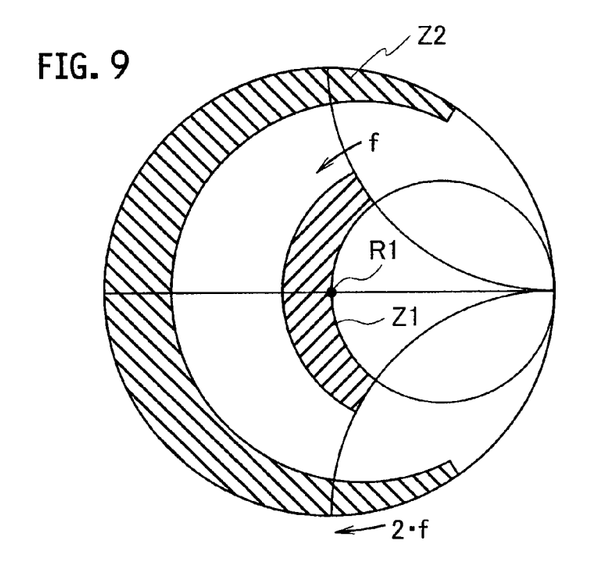
FIG. 9 is a diagram showing an example of a range of load impedances (Smith chart) of a fundamental wave f and a 2nd harmonic $2 \cdot f$, in the class-AB power amplifier according to the embodiment.

In the class-AB power amplifier according to the embodiment, an example of load impedances (Smith chart) of the fundamental wave f and the 2nd harmonic 2·f is expressed, as shown in FIG. 9.

In the actual output side matching circuit 104, although achieving R2=0 is difficult over the broader bandwidths, since it can keep the efficiency ηd and the maximum electric output power Po at high values as R2 and R3 are close to 0, it is applied as R2<1/3·R1 and R2<1/3·R1. In FIG. 9 shows a range of load impedances (Smith chart) of a fundamental wave f and a 2nd harmonic 2·f when R2 is further set to small (that is, applied as R2<1/6·R1), in order to achieve a high degree of efficiency. If Z1=R1+j·X1 and Z2=R2+j·X2 in frequency band are applied into the range in FIG. 9, the output side matching circuit can be designed to so that X2/X1 may be close to −1.90.

Figure 10:
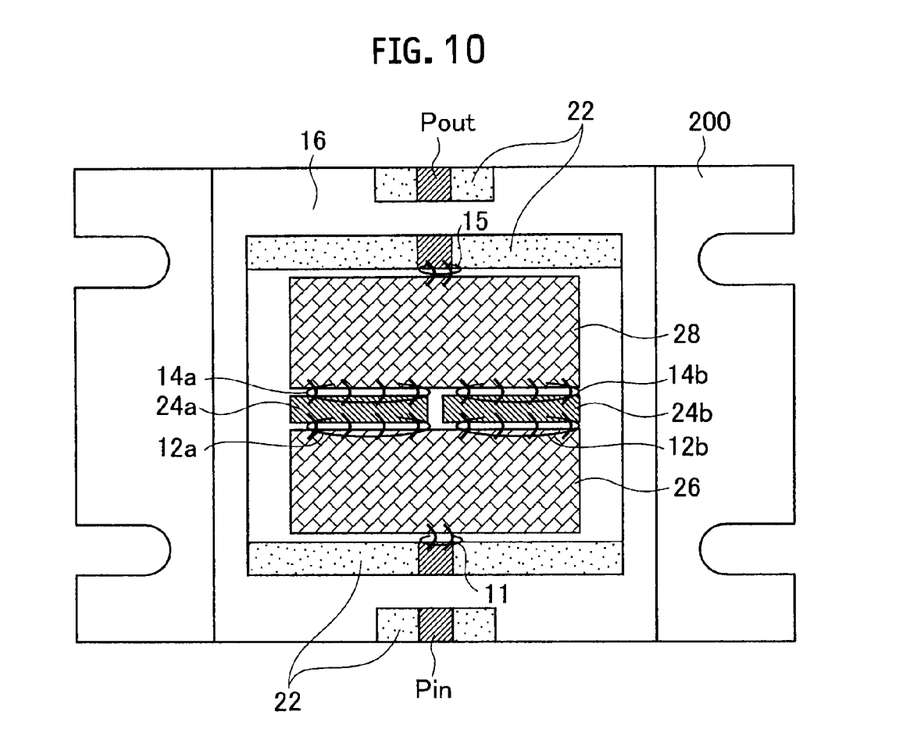
FIG. 10 is a schematic planar pattern configuration diagram showing an example of overview of an inside of housing, in the class-AB power amplifier according to the embodiment.

In the class-AB power amplifier according to the embodiment, a schematic planar pattern configuration showing an example of overview of an inside of housing 200 is expressed as shown in FIG. 10.

As shown in FIG. 10, on the housing 200, the class-AB power amplifier according to the embodiment includes: a ceramic wall 16 configured to be disposed between an input terminal Pin and an output terminal Pout; semiconductor devices 24a and 24b configured to be disposed inside the ceramic wall 16; and an input side matching circuit substrate 26 and an output side matching circuit substrate 28 configured to be disposed to adjoin to the semiconductor devices 24a and 24b, respectively. An input side matching circuit 102 and an output side matching circuit 104 are disposed on the input side matching circuit substrate 26 and the output side matching circuit substrate 28, respectively. In this case, the input side matching circuit 102 and the output side matching circuit 104 are composed by applying a distributed transmission line electrical circuit or a lumped circuit (not shown), etc.

The bonding wire 11 connects between the input terminal Pin and the input side matching circuit substrate 26, the respective bonding wires 12a and 12b connect between the input side matching circuit substrate 26 and the respective semiconductor devices 24a and 24b, the respective bonding wires 14a and 14b connect between the output side matching circuit substrate 28 and the respective semiconductor devices 24a and 24b, and the bonding wire 15 connects between the output side matching circuit substrate 28 and the output terminal Pout. In addition, the input terminal Pin and the output terminal Pout are composed of striplines disposed on insulating layers 22.

Figure 11:
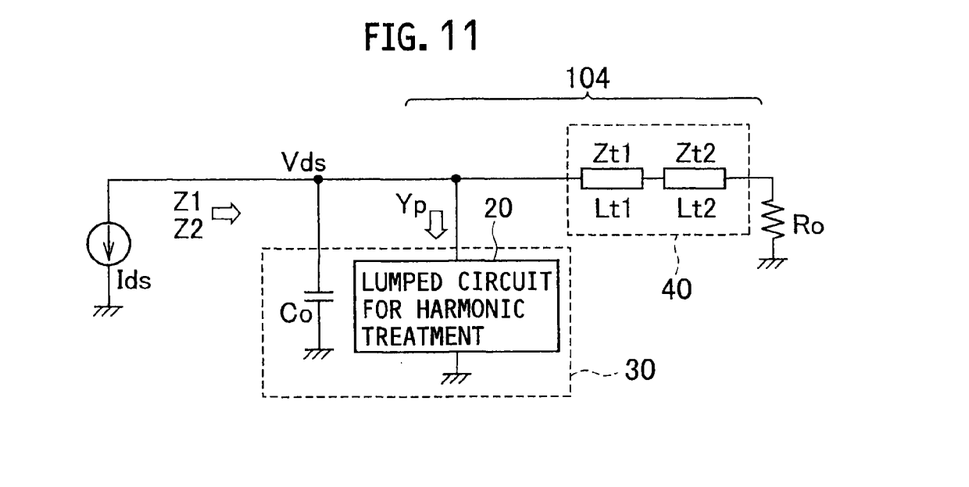
FIG. 11 is a schematic circuit configuration diagram for explaining one embodiment of an output side matching circuit, in the class-AB power amplifier according to the embodiment.

The output side matching circuit 104 may be composed of a distributed transmission line electrical circuit, or a part of the output side matching circuit 104 may be composed of a lumped circuit for harmonic treatment 20, for example, in order to be built in the housing 200 shown in FIG. 10, as shown in FIG. 11.

As shown in FIG. 11, in the class-AB power amplifier according to the embodiment, the output side matching circuit 104 includes a lumped circuit for harmonic treatment 20 and an impedance converting circuit 40. Here, although the lumped circuit for harmonic treatment 20 will be described later, the impedance converting circuit 40 is expressed by a distributed transmission line whose characteristic impedance and length are composed by two stages of Zt1 and Lt1=wavelength/4, and Zt2 and Lt2=wavelength/4.

The lumped circuit for harmonic treatment 20 not only short-circuits the 2nd harmonic of a center frequency fo, but also may achieve the broader bandwidths as a circuit for resonating in parallel with output capacitance Co in fo, for example. Then, the impedance converting circuit 40 performs impedance conversion of R1 to Ro of load. A short circuit is realized by a·ωo and c·ωo, and an open circuit is realized by DC, b·ωo and d·ωo, where the parallel circuit for connecting the output capacitance Co with the lumped circuit for harmonic treatment 20 in parallel is expressed as a reactance circuit 30, its admittance is expressed as Yp, the angular frequency of fo is expressed as ωo=2·π·fo, b is nearly equal to 1, c is nearly equal to 2, and 0<a<b<c<d, and the following equation is satisfied:

$$Yp(s) = Hp \cdot \frac{s \cdot \{s^2 + (b \cdot \omega o)^2\} \cdot \{s^2 + (d \cdot \omega o)^2\}}{\{s^2 + (a \cdot \omega o)^2\} \cdot \{s^2 + (c \cdot \omega o)^2\}}$$

Figure 12:
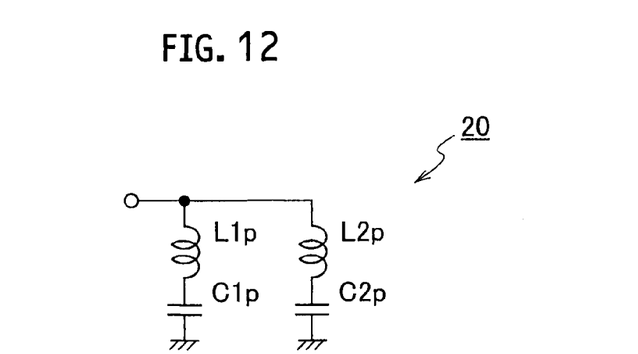
FIG. 12 is a schematic circuit configuration diagram for explaining one embodiment of a lumped circuit for harmonic treatment, in the class-AB power amplifier according to the embodiment.
Figure 13:
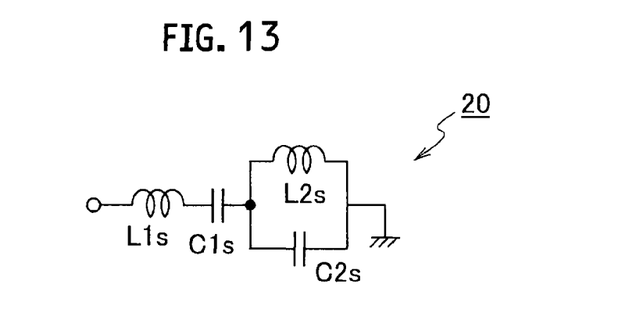
FIG. 13 is a schematic circuit configuration diagram for explaining another embodiment of the lumped circuit for harmonic treatment, in the class-AB power amplifier according to the embodiment.
Figure 14:
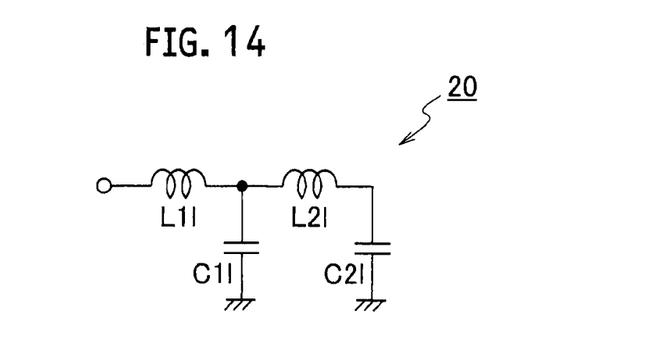
FIG. 14 is a schematic circuit configuration diagram for explaining another embodiment of the lumped circuit for harmonic treatment, in the class-AB power amplifier according to the embodiment.

The Yp is achievable in the following three kinds of circuits. That is, in the class-AB power amplifier according to the embodiment, schematic circuit configurations for explaining one embodiment of the lumped circuit for harmonic treatment 20 can be expressed as shown in FIG. 12 to FIG. 14.

First of all, in the following equation, $$Yp(s) = s \cdot Hp + Yp1(s)$$

which performed partial fraction expansion of Yp(s), it is applied as Hp=Co. If the partial fraction expansion of Yp1(s) is performed, the following equation is satisfied.

$$Yp1(s) = \frac{1}{s \cdot L1p + 1/(s \cdot C1p)} + \frac{1}{s \cdot L2p + 1/(s \cdot C2p)}$$

$$L1p = (c^2 - a^2)/\{Co \cdot \omega o^2 \cdot (b^2 - a^2) \cdot (d^2 - a^2)\}$$

$$C1p = Co \cdot (b^2 - a^2) \cdot (d^2 - a^2)/\{(c^2 - a^2) \cdot a^2\}$$

$$L2p = (c^2 - a^2)/\{Co \cdot \omega o^2 \cdot (c^2 - b^2) \cdot (d^2 - c^2)\}$$

$$C2p = Co \cdot (c^2 - b^2) \cdot (d^2 - c^2)/\{(c^2 - a^2) \cdot c^2\}$$

That is, as shown in FIG. 12, the lumped circuit for harmonic treatment 20 is composed of a parallel series circuit including: a first series circuit composed of an inductor L1p and a capacitor C1p; and a second series circuit composed of an inductor L2p and a capacitor C2p.

Next, if partial fraction expansion of Zp1(s)=1/Yp1(s) is performed, the following equation is satisfied.

$$Zp1(s) = s \cdot L1s + \frac{1}{s \cdot C1s} + \frac{1}{s \cdot C2s + 1/(s \cdot L2s)}$$

$$K1 = \{(b^2 - a^2) \cdot (d^2 - a^2) + (c^2 - b^2) \cdot (d^2 - c^2)\}/(c^2 - a^2)$$

$$K2 = \{c^2 \cdot (b^2 - a^2) \cdot (d^2 - a^2) + a^2 \cdot (c^2 - b^2) \cdot (d^2 - c^2)\}/(c^2 - a^2)/K1$$

$$L1s = 1/(Co \cdot \omega o^2 \cdot K1)$$

$$C1s = Co \cdot K1 \cdot K2/(a \cdot c)^2$$

$$L2s = 1/(C2 \cdot K2 \cdot \omega o^2)$$

$$C2s = Co \cdot K1 \cdot K2/\{(K2 - a^2) \cdot (c^2 - K2)\}$$

That is, as shown in FIG. 13, the lumped circuit for harmonic treatment 20 is composed of a series circuit including a series circuit composed of an inductor L1$s$ and a capacitor C1$s$, and a parallel circuit composed of an inductor L2$s$ and a capacitor C2$s$.

Finally, if continued-fraction expansion of Zp1($s$) is performed, the following equation is satisfied.

$$Zp1(s) = s \cdot L1l + \frac{1}{s \cdot C1l + \frac{1}{s \cdot L2l + 1/(s \cdot C2l)}}$$

$$L1l = 1/(Co \cdot \omega o^2 \cdot K1)$$

$$C1l = Co \cdot K1/(a^2 + c^2 - K2)$$

$$L2l = L1l \cdot (a^2 + c^2 - K2)/\{K2 - a^2 \cdot c^2/(a^2 + c^2 - K2)\}$$

$$C2l = Co \cdot K1 \cdot \{K2 - a^2 \cdot c^2/(a^2 + c^2 - K2)\}/(a^2 \cdot c^2)$$

That is, as shown in FIG. 14, the lumped circuit for harmonic treatment 20 is composed of a ladder type circuit including a series inductor L1I, a parallel capacitor C1I, a series inductor L2I, and a parallel capacitor C2I.

Although frequency characteristics of the three kinds of the circuits are the same, when the capacitor C and the inductor L are fabricated from a low-loss chip capacitor and a bonding wire in the housing 200 shown in FIG. 10, the circuit configuration of FIG. 12 needs to apply three kinds of bonding to drain electrode pads of FETs 24*a* and 24*b*, and the circuit configuration of FIG. 13 needs to apply a chip capacitor into two stories high. On the other hand, the circuit configuration of FIG. 14 is the easiest to mount.

Figure 15:
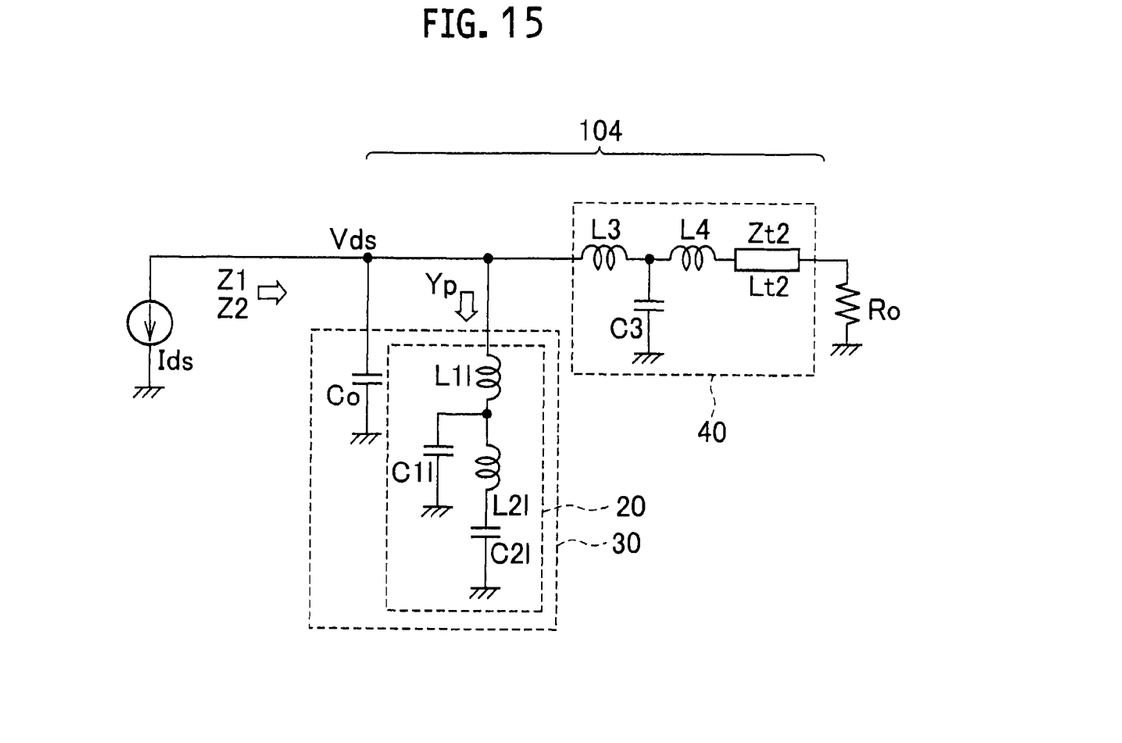
FIG. 15 is a schematic circuit configuration diagram for explaining another embodiment of the output side matching circuit, in the class-AB power amplifier according to the embodiment.

In the class-AB power amplifier according to the embodiment, a schematic circuit configuration for explaining an embodiment of the output side matching circuit 104 to which the lumped circuit for harmonic treatment 20 shown in FIG. 14 is applied is expressed as shown in FIG. 15. In FIG. 15, the lumped circuit for harmonic treatment 20 is composed of a ladder type circuit including a series inductor L1I, a parallel capacitor C1I, a series inductor L2I, and a parallel capacitor C2I, as well as FIG. 14.

Furthermore, since the impedance of the high power FET 108 which connects a plenty of cells in parallel is low, characteristic impedance Zt1 of the distributed transmission line at the side of FET is low, and the line width of the distributed transmission line on the alumina substrate whose relative dielectric constant is about 10 becomes wider than the width of the FET chip, in the impedance converting circuit 40 in FIG. 11. On the other hand, since the substrate having a high relative dielectric constant is easy to be broken, its degree of difficulty for mounting the substrate having a large area is great. Accordingly, the distributed transmission line of Zt1 is displaced to a lumped circuit including an inductor L3, a capacitor C3 and an inductor L4, as shown in FIG. 15.

Figure 16:
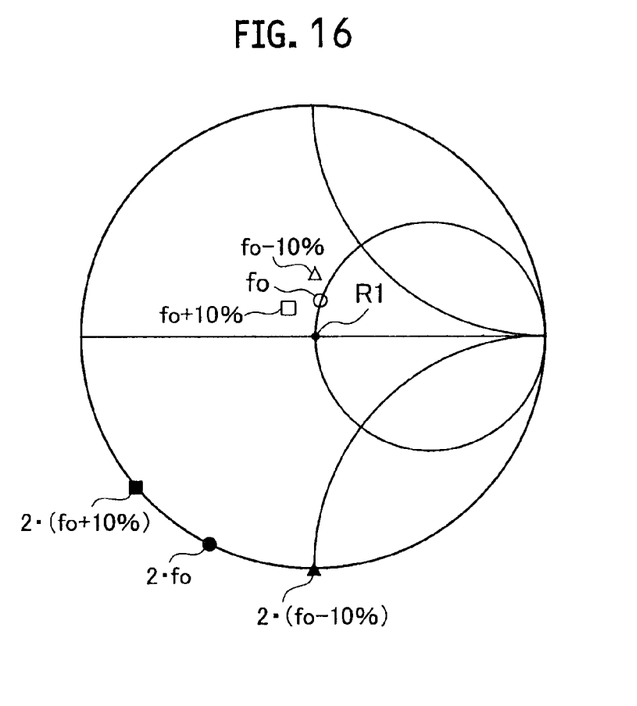
FIG. 16 is a diagram showing an example of load impedances (Smith chart) of a fundamental wave, and a 2nd harmonic, in the class-AB power amplifier according to the embodiment.

In the class-AB power amplifier according to the embodiment, an example of load impedances (Smith chart) of the fundamental wave and the 2nd harmonic is expressed, as shown in FIG. 16.

Although characteristics are effective if frequency a·fo which is short-circuited is low, the capacitance of the capacitor C2 will become large. Therefore, for example, as shown in FIG. 16, if applied as a=0.2, and frequencies b·fo, c·fo, and d·fo are optimized, X2/X1=−1.90 is satisfied at fo−5%, X2/X1=−1.90 is satisfied at fo, and X2/X1=−1.90 is satisfied at fo+10%, and X2/X1=−1.90 is neared at 20% of fractional bandwidth, at the time of b=1.13, c=2.45, and d=2.75.

Figure 17:
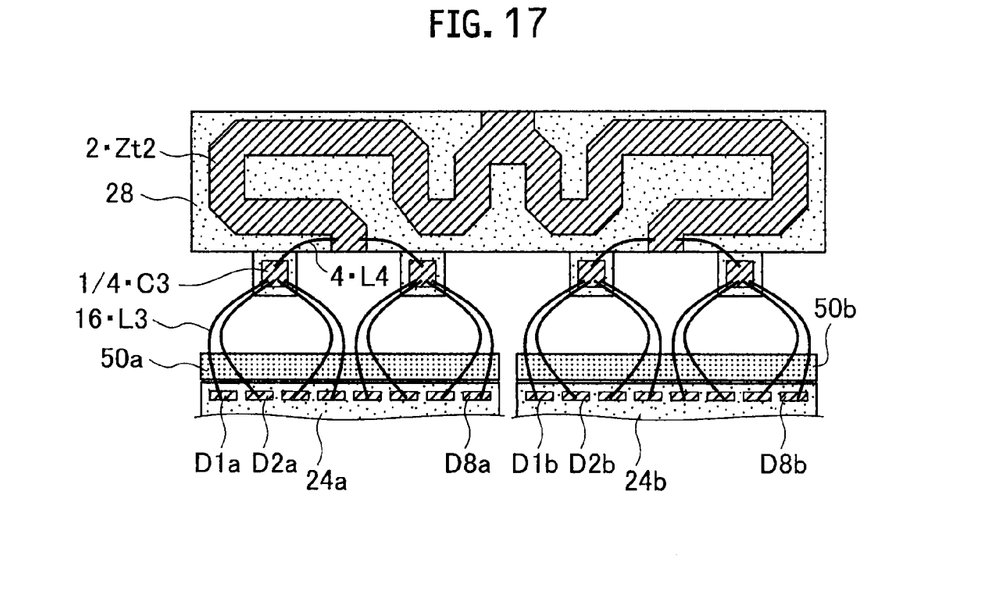
FIG. 17 is a schematic planar pattern configuration diagram showing one embodiment of an overview of the output side matching circuit, in the class-AB power amplifier according to the embodiment.

A schematic planar pattern configuration diagram showing one embodiment of an overview of the output side matching circuit 104 in the class-AB power amplifier according to the embodiment is expressed as shown in FIG. 17. Also, a schematic planar pattern configuration showing one embodiment of an overview of the lumped circuit for harmonic treatment unit 50 (50*a*, 50*b*) near the FET chip is expressed as shown in FIG. 18.

FIG. 17 shows one embodiment which performs power combining between two chips composed of the FETs 24*a* and 24*b*. In order to connect in parallel, characteristic impedance of one side of the distributed transmission line formed on the output side matching circuit substrate 28 is set to 2·Zt2 which is 2-fold as compared with Zt2.

In order to ensure uniform load impedance matching and harmonic treatment for the fundamental wave, the capacitor C3 is divide into four pieces, each the four pieces is set to 1/4·C3, and then the FET chip is divided into eight cells. The drain terminal electrodes of the FET 24*a* and 24*b* are divided into eight pieces, respectively, and are expressed with D1*a*, D2*a*, . . . , D8*a*, D1*b*, D2*b*, . . . , D8*b*, respectively. Then, since each of the drain terminal electrode is parallel connection, each inductor L4 is increased by 4-fold, and each inductor L3 is increased by 16-fold. Although each of the bonding wire is expressed as one piece in FIG. 17, and may be increased to the required number by reviewing current capacity in actuality.

Figure 18:
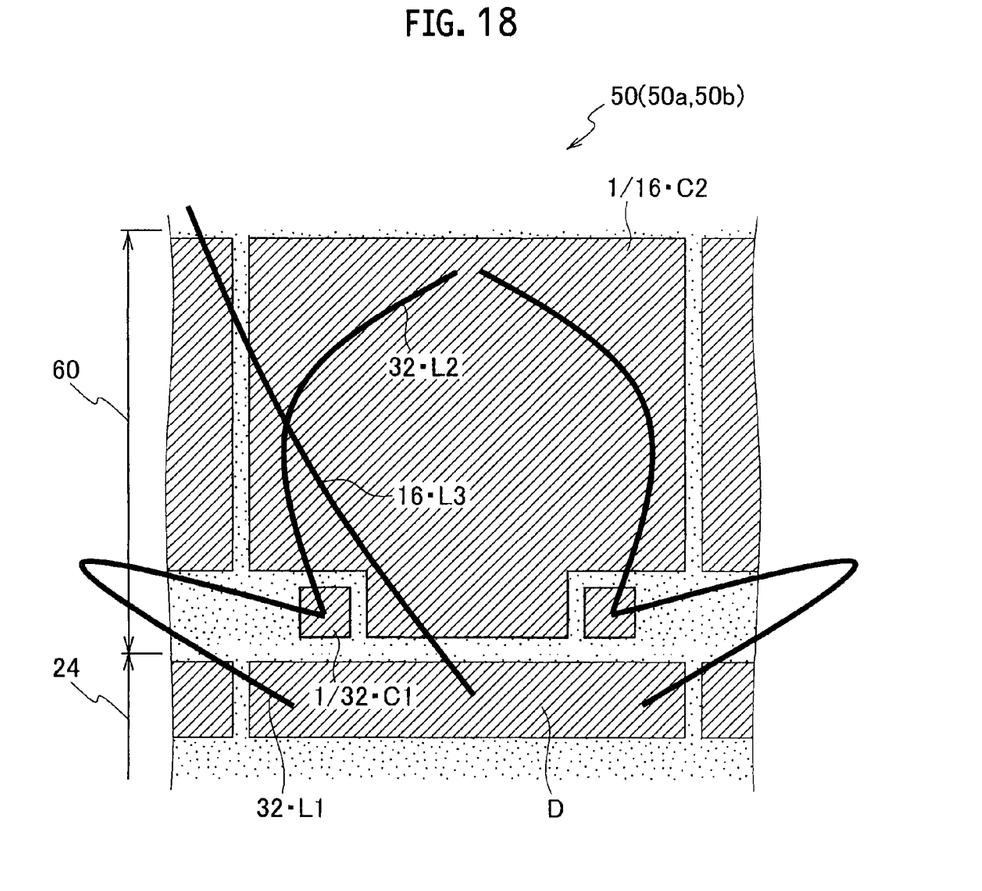
FIG. 18 is a schematic planar pattern configuration diagram showing one embodiment of an overview near an FET chip, in the class-AB power amplifier according to the embodiment.

As shown in FIG. 18, a capacitor C1, a capacitor C2, an inductor L1, and an inductor L2 are disposed on the lumped circuit for harmonic treatment unit 50 (50*a* and 50*b*) omitted here. That is, in order to reduce mounting variation, the capacitor C1 and the capacitor C2 are built on the same capacitor substrate, and the capacitor C1 is divided into 32 pieces and the capacitor C2 is divided into 16 pieces. Stitch bonding is used in order to reduce the number of times of bonding of the small area capacitor C1 to one time. Therefore, in order that the bonding positions between the inductor L1 and the inductor L2 may be aligned in line, the bonding is performed in "reverse V"-shaped. Also, since the inductor L2 and the inductor L3 cross, bonding of the inductor L2 is formed lower than that of the inductor L3, and bonding of the inductor L3 is formed higher than that of the inductor L2.

On the other hand, in a Monolithic Microwave Integrated Circuit (MMIC) etc., since a multilayer structure is possible (and thereby a degree of flexibility in wire routing is high), and a capacitor can also be two stories high, it can achieve not only the configuration shown in FIG. 14 but also the configuration shown in FIG. 12 or FIG. 13 without any difficulty. In addition, even when parasitic inductances of VIA hole for grounding cannot be ignored, the parasitic inductance of two point of the grounding in FIG. 12 can be accommodated by design by treating with a part of the inductor L1*p* or the inductor L2*p*. Also, the parasitic inductances of one point of the grounding in FIG. 13 can be accommodated by design by treating with a part of the inductor L1s. On the other hand, since the parasitic inductances of the grounding of the capacitor C1I in FIG. 14 cannot be accommodated by design, a frequency characteristic becomes worse.

In addition, in MMIC etc., L and C of the lumped element may be used as a quasi-lumped element.

When the conduction angle θo/(2·π)=1/8 is set, the efficiency ηd=98.5% can be achieved, and Lo will also further improve at −0.91 dB. However, since the maximum electric output power Po degrades by no less than 4.85 dB, it is not practical to decrease the conduction angle θo any further.

As mentioned above, in the output side matching circuit 104, if the relationship between variables X1 and R1 is set to −R1<=X1<=R1, variable R1 is set to R1=Vdc/Imax·π·{1−cos(θo/2)}/{θo/2−sin(θo/2)}, and variable X2/X1 to X2/X1=−{θo/2−sin(θo/2)}/{sin(θo/2)−sin(1.5·θo)/3}, or each of the variables is set thereto so as to become equal substantially, the same linearity, the same efficiency ηd, and the same maximum electric output power Po as the class-AB operation highly efficient than the class-B operation are achievable over the broader bandwidths.

According to the embodiment, in the class-AB operation whose conduction angle θo is more than π(rad), the load impedance of the fundamental wave, and the load impedance of the 2nd harmonic are applied as a function of θo, and thereby providing the class-AB power amplifier having the high linearity and the high degree of efficiency over the broader bandwidths.

According to this embodiment, the class-AB power amplifier having the high linearity and the high degree of efficiency over the broader bandwidths can be provided.

The Other Embodiments

While a certain embodiment has been described, the embodiment has been presented by way of examples only, and is not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In addition, it needless to say that not only the FET but also a Bipolar Junction Transistor (BJT), a High Electron Mobility Transistor (HEMT), a Laterally Diffused Metal-Oxide-Semiconductor Field Effect Transistor (LDMOS), and a Heterojunction Bipolar Transistor (HBT), or a vacuum tube, etc. are applicable as an amplifying element mounted in the class-AB power amplifier according to the embodiment described herein.

Such being the case, the present invention covers a variety of embodiments, whether described or not.

What is claimed is:

1. A class-AB power amplifier comprising:
an amplifying element whose power supply voltage is expressed as Vdc and whose maximum current is expressed as Imax, a conduction angle θo of the amplifying element being less than 2·π(rad) and more than π(rad), and load impedance of a fundamental wave being expressed as Z1=R1+j·X1 and load impedance of a 2nd harmonic being expressed as Z2=R2+j·X2 which are observed from a dependent current source of an equivalent circuit of the amplifying element, wherein
a relationship between variables X1 and R1 is set to −R1<=X1<=R1, variable R1 is set to R1=Vdc/Imax·π·{1−cos(θo/2)}/{θo/2−sin(θo/2)}, and variable X2/X1 to X2/X1=−{θo/2−sin(θo/2)}/{sin(θo/2)−sin(1.5·θo)/3}, or each of the variables is set thereto so as to become equal substantially, and
R2<1/3·R1 is applied.

2. The class-AB power amplifier according to claim 1, wherein
an output side matching circuit is connected to the amplifying element, and the output side matching circuit comprising a distributed transmission line electrical circuit.

3. The class-AB power amplifier according to claim 1, wherein
an output side matching circuit is connected to the amplifying element, and the output side matching circuit comprising a lumped circuit and a distributed transmission line electrical circuit.

4. The class-AB power amplifier according to claim 1, wherein
an output side matching circuit is connected to the amplifying element, and the output side matching circuit comprising a lumped circuit for harmonic treatment and an impedance converting circuit.

5. The class-AB power amplifier according to claim 4, wherein
the output side matching circuit comprises a reactance circuit composed of a parallel circuit of the lumped circuit for harmonic treatment and the output capacitance of the amplifying element.

6. The class-AB power amplifier according to claim 5, wherein
the lumped circuit for harmonic treatment is a parallel circuit including a first series circuit composed of a first inductor and a first capacitor, and a second series circuit composed of a second inductor and a second capacitor.

7. The class-AB power amplifier according to claim 5, wherein
the lumped circuit for harmonic treatment is a series circuit including a series circuit composed of a third inductor and a third capacitor, and a parallel circuit composed of a fourth inductor and a fourth capacitor.

8. The class-AB power amplifier according to claim 5, wherein
the lumped circuit for harmonic treatment comprises a ladder type circuit composed of a fifth inductor connected in series, a fifth capacitor connected in parallel, a sixth inductor connected in series, and a sixth capacitor connected in parallel.

9. The class-AB power amplifier according to claim 1, wherein
the amplifying element is one selected from the group consisting of a field effect transistor, a bipolar junction transistor, a high electron mobility transistor, a hetero junction bipolar transistor, and a vacuum tube.

* * * * *